United States Patent
Meister et al.

(10) Patent No.: US 10,379,179 B2
(45) Date of Patent: Aug. 13, 2019

(54) FASTENING DEVICE FOR AN NMR PROBE HAVING A QUICK-RELEASE FASTENER

(71) Applicant: Bruker BioSpin AG, Faellanden (CH)

(72) Inventors: Roger Meister, Hinteregg (CH); Markus Mayer, Gossau (CH); Alexander Krahn, Karlsruhe (DE)

(73) Assignee: BRUKER BIOSPIN AG, Faellanden (CH)

( * ) Notice: Subject to any disclaimer, the term of this patent is extended or adjusted under 35 U.S.C. 154(b) by 0 days.

(21) Appl. No.: 16/123,530

(22) Filed: Sep. 6, 2018

(65) Prior Publication Data

US 2019/0072625 A1 Mar. 7, 2019

(30) Foreign Application Priority Data

Sep. 7, 2017 (DE) .................. 10 2017 215 763

(51) Int. Cl.
*G01V 3/00* (2006.01)
*G01R 33/34* (2006.01)
(Continued)

(52) U.S. Cl.
CPC ....... *G01R 33/34007* (2013.01); *G01R 33/30* (2013.01); *G01R 33/3875* (2013.01); *G01R 33/3802* (2013.01); *G01R 33/3873* (2013.01)

(58) Field of Classification Search
CPC .............................................. G01R 33/34007
(Continued)

(56) References Cited

U.S. PATENT DOCUMENTS 5,457,387 A * 10/1995 Patrick ................... G01R 33/34
324/318
2009/0015259 A1 1/2009 Alistair
(Continued)

FOREIGN PATENT DOCUMENTS

DE 102013204131 B3 2/2014
DE 102013212312 B4 2/2017

OTHER PUBLICATIONS

Marek, et al., Bruker "Manual Probes", Bruker BioSpin, User Manual Verision 003, (updated Jul. 2, 2009), 54 pages.
(Continued)

*Primary Examiner* — Louis M Arana
(74) *Attorney, Agent, or Firm* — Edell, Shapiro & Finnan, LLC

(57) ABSTRACT

A fastening system for attaching an NMR probe to an NMR magnet includes a discoid insert and a retention system that is rigidly connected to the magnet and on which the insert can be mounted. A form-fitting, variable-force connection is established between the NMR probe and the retention system using a spring element. The probe attaches to the insert by a plurality of integral, rigid retaining elements that are of an invariable fixed length. The spring element and the retaining elements are designed geometrically such that in a first, opened state the connection between the insert and the retaining elements has a mechanical backlash between 0.5 mm and 5 mm when the spring element is relaxed. In a second, closed state the connection between the insert and the retaining elements has no mechanical backlash when the spring element is under mechanical tension.

20 Claims, 3 Drawing Sheets

(51) Int. Cl.
    *G01R 33/30*     (2006.01)
    *G01R 33/3875*     (2006.01)
    *G01R 33/3873*     (2006.01)
    *G01R 33/38*     (2006.01)

(58) Field of Classification Search
    USPC .................................... 324/318, 319, 320
    See application file for complete search history.

(56)           References Cited

U.S. PATENT DOCUMENTS

2014/0253124 A1    9/2014   Baumann
2015/0002152 A1*   1/2015   Schmidig ............. G01R 33/307
                                                               324/318

OTHER PUBLICATIONS

German Office Action dated May 7, 2018, 4 pages, with English translation, 4 pages.

* cited by examiner

FASTENING DEVICE FOR AN NMR PROBE HAVING A QUICK-RELEASE FASTENER

CROSS REFERENCE TO RELATED APPLICATIONS

This application claims foreign priority under 35 U.S.C. § 119(a)-(d) to German Application No. 102017215763 filed on Sep. 7, 2017, the entire contents of which are hereby incorporated into the present application by reference.

FIELD OF THE INVENTION

The invention relates to a fastening device for releasably fastening a Nuclear Magnetic Resonance (NMR) probe to an NMR magnet.

BACKGROUND

NMR methods are used to analyze sample compositions or to determine the structure of substances in samples. NMR spectroscopy is an efficient method of instrumental analysis. In some NMR methods, the sample is exposed to a strong, static magnetic field $B_0$ in a z-direction. In the process, the magnetic field interacts with the nuclear spin of the sample material, in particular the nuclear spin of the sample aligns with the static magnetic field $B_0$. High-frequency (HF) electromagnetic pulses are radiated into the sample in the x- or y-direction, e.g. orthogonal to the static magnetic field. The temporal development of this nuclear spin of the sample in turn generates high-frequency electromagnetic fields which are detected in the NMR apparatus. Information regarding the properties of the sample can be obtained, over a specific spatial region, from the detected HF fields. In particular, the chemical composition and the chemical bonding relationships in the sample can be concluded from the position and intensity of NMR lines The analysis sample generally comprises a cylindrical sample tube that typically has a circular, oval, or rectangular cross section and contains the solid or liquid measurement substance. The sample tube is closed at least at the side by which it first penetrates into the probe, and is typically located in a spinner. The sample tube and the spinner are transported into the probe from outside the magnet, e.g., using a transport system. As described herein, the insertion opening is located at the top on the probe, and the sample tube is inserted into the probe from the top. It is also conceivable, however, to insert the sample tube and/or spinner into the probe from below, into an opening provided therefor. This case is analogous to that mentioned above and will not be described explicitly, for reasons of clarity. When the sample tube is in the measuring position, the spinner is inside the turbine, which allows the sample tube to rotate.

Conventional "standard bore" probes currently available may be fastened to a shim system by means of two screws. This is very inconvenient for the user, since the user typically crawls under the magnet in order to mount the probe and works kneeling down. In addition, the relatively small screws are generally inconvenient due to the mounting position of the probe on the magnet and can normally be tightened only using a special screwdriver.

When the fastening screws are tightened, the connection is fixed and can no longer be adapted to later position changes, which may be caused by temperature changes, for example. These position changes may cause mechanical backlash or unacceptable axial tension between the probe and the retention system.

Conventional "wide bore" probes are typically mounted on the retention system using a quick-release fastener. Due to the link form of the typical clamping system, the maximum force is applied to the probe when the clamping ring is operated at the very start of the mounting process. After this maximum force has been overcome, the system relaxes and the probe may be mounted to the shim system of the NMR apparatus with an undefined force until a backlash arises that is possibly outside of acceptable tolerances.

In order to prevent these difficulties, a user will typically individually adjust the retaining elements to the relevant shim system for each probe. However, the user may not be able to control the force that is set in the process. It is merely possible to check whether or not mechanical backlash exists, whether within tolerances or not.

These circumstances typically preclude the use the quick-release fastener already known from the "wide bore" probes to mount "standard bore" probes, since the "standard bore" probes generally require that there should be no backlash at all and relatively low force between the probe and the shim system.

In addition, the known quick-release fasteners of "wide bore probes generally provide no form of locking against inadvertent opening. However, "standard bore" probes may require the positive locking feature due to safety considerations and marketing considerations.

SUMMARY OF THE INVENTION

The techniques presented herein modify a fastening device of the type defined at the outset, using technical measures that are as simple as possible, such that the disadvantages listed above are prevented entirely or at least as far as possible without reducing the quality of the NMR measurements. The NMR probe described herein remains particularly compact and reduces the material costs and manufacturing outlay.

The techniques presented herein also allow the NMR probe to be changed quickly without thereby risking a significantly reduced service life of the probe.

The fastening device described herein includes the features defined at the outset, such the probe attaches to an insert of the fastening device through a plurality of rigid retaining elements that are each integral and are of an invariable fixed length. A spring element of the insert, and the rigid retaining elements, are designed geometrically such that in a first (e.g., opened) state, the connection between the insert and the retaining elements has a mechanical backlash between 0.5 mm and 5 mm, with the spring element being relaxed. In a second (e.g., closed) state the connection between the insert and the retaining elements has no mechanical backlash, with the spring element being subject to mechanical tension.

In contrast to conventional art, in the closed state, the fastening device described herein exerts a force that is defined in a specific range and that is applied between the probe and the retention system, both for "wide bore" probes and for "standard bore" probes. The spring element is designed, according to one example, such that the retaining force increases continuously when the retaining element is actuated and reaches its maximum in the final position. This example of the spring element enables backlash to be eliminated between the probe and the NMR magnet system or a shim system in the final mounting position.

The quick-release fastener described herein prevents a user from making incorrect adjustments when mounting the NMR probe to the retention system, for example, when adjusting the retaining elements in a "wide bore" system.

The quick-release system described herein absorbs the length tolerances of the components with spring elements. As such, the system is no longer in a mechanically undefined state.

It is explicitly noted at this point that the advantages of the techniques described herein may be achieved not only in vertical NMR spectrometers but also in NMR systems having a horizontal or oblique z-axis. In these examples, the axial positions are no longer necessarily "above" or "below" the NMR magnet coil system, but optionally also to the "right" or "left" thereof. In any case, the force of gravity plays an insignificant role in the operating principle of the present invention.

In some examples, the NMR probe may be fastened to the insert using precisely two opposing retaining elements (e.g., retaining bolts). These examples are extremely simple in design and promote quick and reliable mounting of the probe on or dismantling of the probe from NMR magnets.

In other examples of the fastening device described herein, the spring element is designed such that the retaining force increases continuously when the retaining element is actuated and reaches its maximum in the end position, in the second, closed state. This is a significant advantage compared to a conventional "wide bore" system that typically requires the maximum force to be overcome first and may require an undefined retaining force up to mechanical backlash to be present on the system in the closed position.

In further examples of the fastening device, the spring element is designed such that a connection with no backlash forms between the probe and the retention system before the insert reaches its end position (i.e., in the second, closed state) when rotated in the closure direction.

In still further examples, the discoid insert is designed as a quick-mounting device, such as a bayonet connector, which is rotatable about the disc axis, in parallel with the z-direction. One advantage of an assembly of this kind is a short actuation path for mounting the probe on the retention system.

In some examples of the fastening device described herein, a locking device is provided for locking against inadvertent release of the retainer. The locking mechanism protects the new fastening system against inadvertent opening.

In additional examples of the fastening device described herein include a probe that is fastenable to the insert by a plurality of (e.g., two) opposing retaining elements (e.g., retaining bolts), which are arranged on a pitch circle of between 10 cm and 15 cm. The retaining elements have a maximum radial linear extent in the disc plane of the insert of between 5 mm and 10 mm, typically approximately 8 mm. These dimensions allow the fastening device to function for standard bore and wide bore systems, while minimizing any space requirement.

Alternative or additional examples of the fastening device described herein comprise an overall height of the complete fastening device in parallel with the disc plane of the insert between 7 mm and 15 mm, typically approximately 10 mm. A small overall height of the fastening device enables a maximum amount of space available for the probe. The minimal overall height of the fastening device is specified by the desired spring excursion. This spring excursion is directly reflected in the overall height of the fastening device.

In other examples of the fastening device, the discoid insert comprises a spring link made of non-magnetic material, preferably phosphor bronze, such as Berylco®. A non-magnetic material minimizes any additional forces resulting from the interaction between the NMR magnet and magnetic materials, which may act on the mechanism. In addition, a magnetic material may lead to field disturbances which can then influence the NMR measurement.

In some examples of the fastening device, the spring link is integral to the fastening device. This allows, in a particularly simple manner, for cost-effective manufacture (e.g., no mounting work) and for optimal use of the installation space. In the case of an integral element, no connection members requiring installation space are needed. This installation space can be used for spring strength and spring length. This in turn results in greater spring excursion.

Another example of the fastening device includes a retaining portion, on which the insert is reversibly mountable. The retaining portion is rigidly fastened to the lower face of the retention system that is remote from the magnet. This enables the quick-release fastener to be retrofitted to already-installed NMR magnets or retention systems. The retaining portion may radially surround the insert, in the manner of a housing, in the mounted state. In this example, the insert is cleanly guided for a rotational movement, and the insert is protected in the housing.

In some examples, a sliding bearing is provided between the retaining portion and the insert. The sliding bearing minimizes the operating force of the fastening device. The sliding bearing enables significantly easier mounting of the NMR probe in comparison with the ball bearing of a typical wide bore fastening device. The sliding bearings may be improved by selecting the materials of the sliding partners in the sliding bearing such that the operating force and the wear are minimized, such as by selecting crystalline polyethylene terephthalate (PET-C) and Berylco® as sliding partners. In this example, the main components (e.g., insert and retaining element) can be used directly as the sliding partners due to this material selection.

In further examples, the combination of the spring element, the length of the probe, and the length of the retention system is designed such that actuation of the insert triggers a spring excursion $f \geq 2$ mm. In these examples, all the mechanical manufacturing tolerances may be absorbed preventing backlash with absolute certainty.

In some examples of the fastening device described herein include designing the retention system as a shim system for field shaping of the homogenous magnetic field in an NMR spectrometer.

An NMR measurement assembly comprising the fastening device described is also covered by the scope of the present invention. The NMR assembly may also comprise one or more of an NMR magnet system, a shim system, or a cryostat.

Further advantages of the fastening device can be found in the description and the drawings included herein. Likewise, the features mentioned above and set out in the following may each be used individually per se or together in any combination.

The embodiments shown and described are not to be understood as an exhaustive list, but instead are of an exemplary nature for describing the invention.

BRIEF DESCRIPTION OF THE DRAWINGS

The invention is shown in the drawings and will be described in greater detail with reference to specific examples. In the drawings.

DETAILED DESCRIPTION

Figure 1A:
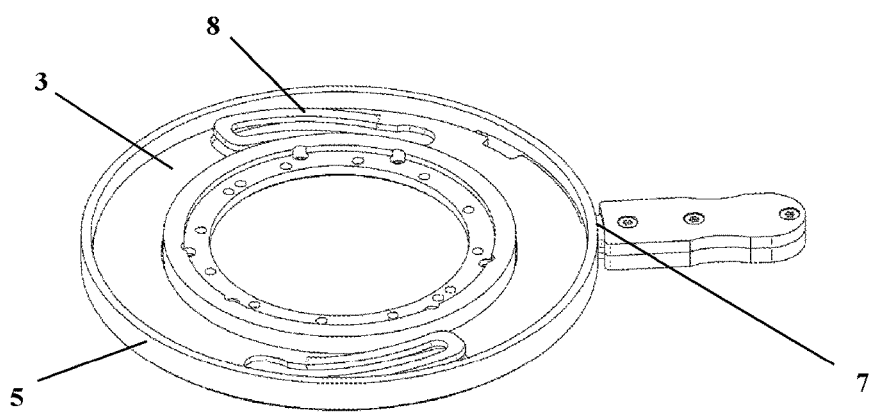
FIG. 1A is a schematic spatial side view, obliquely from above, of an example embodiment of the fastening device.

In general, the techniques described herein relate to a modified fastening device for releasably fastening an NMR probe 1 to an NMR magnet 2. The main axis of the NMR magnet 2 extends in parallel with a z-direction. To fasten the NMR probe 1 to the NMR magnet 2, a discoid insert 3 is pushed from below against a retention system 4 that is rigidly connected to the lower face of the NMR magnet 2. The NMR probe 1 is pushed against the lower face of the insert 3 that is remote from the retention system 4 until the upper end of the probe 1 comes into contact with the upper end of the retention system 4. Rotating the insert 3 about its disc axis (e.g., in parallel with the z-direction) establishes a rigid mechanical connection between the probe 1 and the insert 3 and between the insert 3 and the retention system 4. The discoid insert 3 is designed to establish a form-fitting and variable-force connection between the probe 1 and the retention system 4, using a spring element 8.

In one example, the probe 1 attaches to the insert 3 using a plurality of opposing retaining elements 6 that may be designed as two simple retaining bolts. Each of the retaining elements 6 may be integral, rigid, and of an invariable, fixed length.

In another example, the spring element 8 of the insert 3 and the retaining elements 6, are designed geometrically such that in a first (e.g., opened) state, with the spring element 8 relaxed, the connection between the insert 3 and the retaining elements 6 includes a mechanical backlash between 0.5 mm and 5 mm. In a second (e.g., closed) state, with the spring element 8 being under mechanical tension, the connection between the insert 3 and the retaining elements 6 does not include any mechanical backlash. In general, the retaining force will increase continuously when the retaining element 6 is actuated and will reach its maximum in the end position, in the second, closed state.

The backlash in the connection between the probe 1 and the retention system 4 may be eliminated before the insert 3 reaches its end position (i.e., in the second, closed state) when rotated in the closure direction.

In one example, the discoid insert 3 may be designed as a quick-mounting device, such as a bayonet connector, which is rotatable about the disc axis, i.e., in parallel with the z-direction.

Figure 1B:
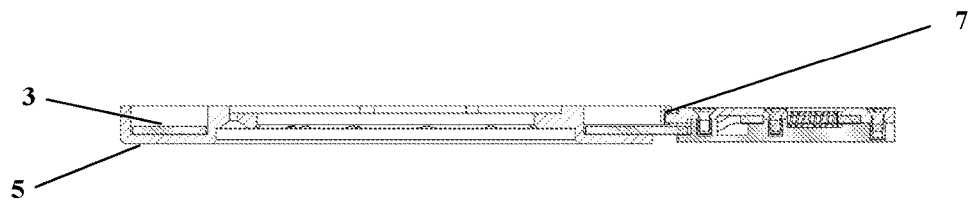
FIG. 1B is a schematic side view of an example embodiment in a vertical cross section.

In one example of the fastening device according to the invention shown in FIG. 1A and FIG. 1B, a locking device 7 prevents inadvertent release of the retainer.

Additionally, as depicted in FIG. 1A and FIG. 1B, the spring element 8 may be integral with the discoid insert 3. In general, the spring element 8 may be produced from non-magnetic material, such as phosphor bronze.

Additionally, FIG. 1A and FIG. 1B show an example in which the insert 3 is reversibly mounted on a retaining portion 5. The retaining portion 5 may be rigidly fastened to a lower face of the retention system 4 that is remote from the magnet. The retaining portion 5 radially surrounds the insert 3 in the mounted state, and may act as a protective housing. A sliding bearing (not shown separately in the drawings) may be provided between the retaining portion 5 and the insert 3. The sliding partners in the sliding bearing may be constructed from materials selected such that the operating force and the wear are minimized, such as PET-C and Berylco®.

In general, the discoid insert 3 may use the spring element 8 to establish a form-fitting, variable-force connection between the probe 1 and the retention system 4 In one example, the spring element 8 may be designed such that its actuation triggers a spring excursion f≥2 mm.

Figure 2:
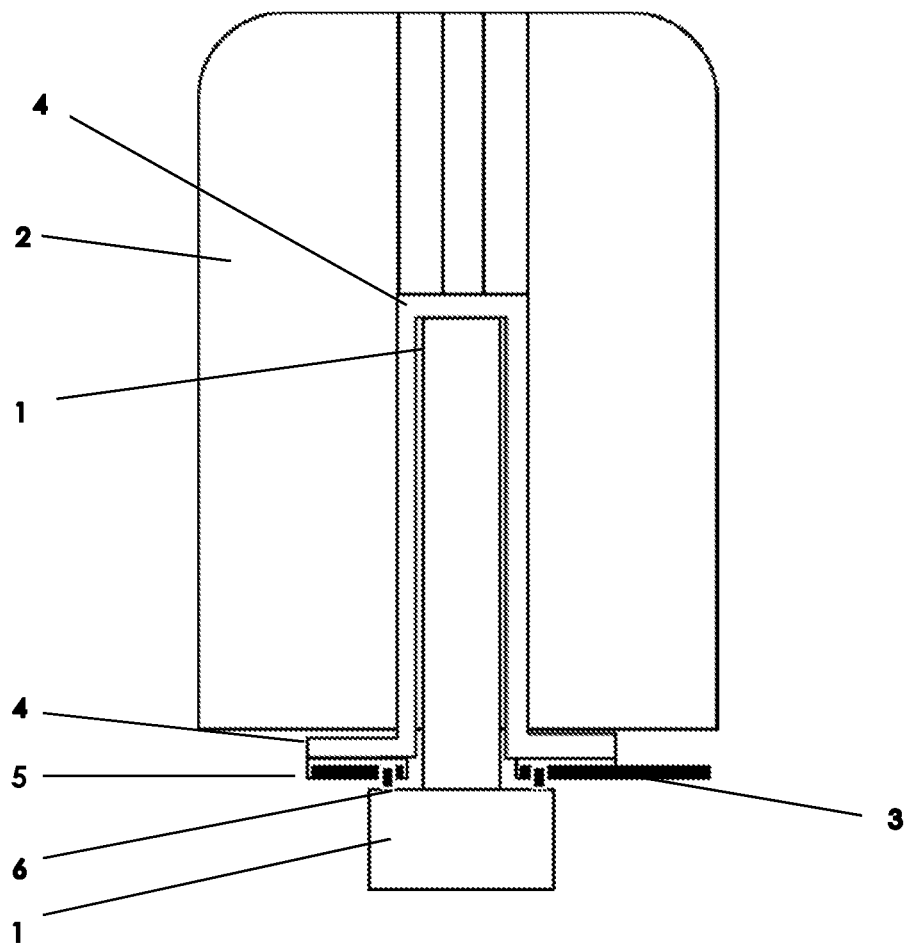
FIG. 2 is a schematic vertical cross section of an NMR spectrometer comprising the fastening device according to an example embodiment.

FIG. 2 schematically shows an example of how the fastening system allows for quickly mounting an NMR probe 1 on an NMR magnet 3, and/or disconnecting the NMR probe 1 from the NMR magnet 2. The discoid insert 3, which attaches to retaining elements of the NMR probe 1, is pushed from below against the lower face of a retention system 4 that is arranged on the NMR magnet 2 to rigidly connect the insert 3 to the NMR magnet 2. Rotating the insert 3 about the disc axis subsequently establishes a rigid mechanical connection between the probe 1 and the retention system 4 via the insert 3. In one example, the retention system 4 may comprise a shim system for field shaping of the homogenous magnetic field in an NMR spectrometer.

Figure 3:
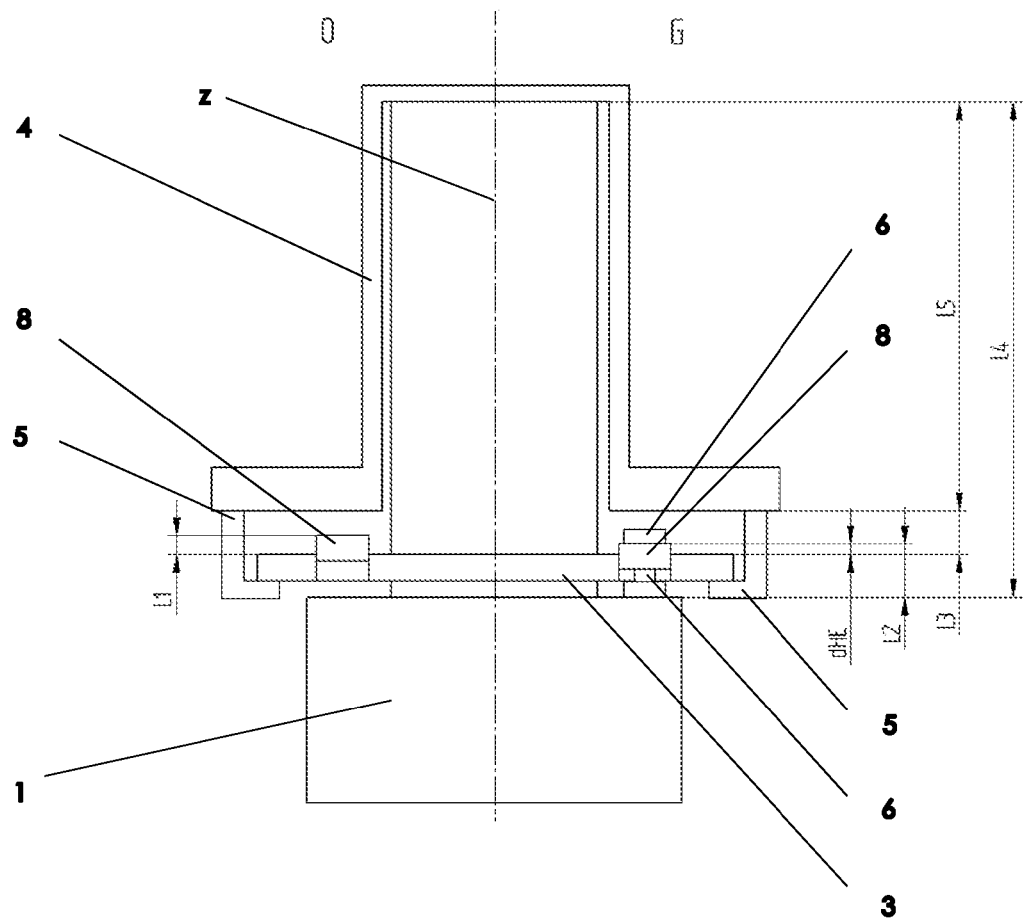
FIG. 3 is a schematic vertical section through a probe mounted on the retention system, specifically in the first, open state between the insert and the retaining elements in the left-hand half (O) of the drawing, and in the second, closed state in the right-hand half (G) of the drawing.

FIG. 3 shows a schematic vertical section through a probe 1 mounted on the retention system 4 to demonstrate an example in which the relative distances of the system components involved behave in the two mounting states. Specifically, FIG. 3 depicts the first (e.g., open) state between the insert 3 and the retaining elements 6 in the left-hand half of the drawing (denoted by "O"), and in the second (e.g., closed) state in the right-hand half of the drawing (denoted by "G").

As shown in FIG. 3:
L1 is the untensioned height of the spring element 8
L2 is the height of the retaining elements 6
L3 is the height of the insert 3
L4 is the height of the NMR probe 4
L5 is the height of the retention system 5
dHE is the backlash between the insert 3 and the retaining elements 6

The geometric relationships $$(L5\_min + L3\_min) - (L4\_max - L2\_min) = dHE\_min$$

$$(L5\_max + L3\_max) - (L4\__{min}\_L2\_max) = dHE\_max$$

meet the following geometric conditions:
Geometric conditions for zero-backlash:
L1>dHE_max
Geometric conditions for mountability:
dHE_max>0

LIST OF REFERENCE SIGNS

1 NMR probe
2 NMR magnet
3 insert
4 retention system
5 retaining portion
6 retaining element
7 locking device
8 spring element

What is claimed is:

1. A fastening device for releasably fastening a Nuclear Magnetic Resonance (NMR) probe to an NMR magnet with a main axis that extends in parallel with a z-direction and defines upper and lower faces as well as upper and lower ends, the fastening device comprising:
   a retention system rigidly connected to a lower face of the NMR magnet;
   a discoid insert configured to fasten the NMR probe against the retention system,
wherein the NMR probe is pushed against a lower face of the discoid insert facing away from the retention system until an upper end of the NMR probe contacts an upper end of the retention system, and wherein a rigid mechanical connection is established between the NMR probe and the discoid insert and between the discoid insert and the retention system by rotating the discoid insert about a disc axis that extends in parallel with the z-direction; and
   a spring element, configured to establish a form-fitting, variable-force connection between the NMR probe and the retention system,
wherein the NMR probe attaches to the discoid insert through a plurality of integral, rigid retaining elements that are each of an invariable fixed length,
and wherein the spring element and the plurality of rigid retaining elements are configured geometrically such that:
   the form-fitting, variable-force connection has a mechanical backlash between 0.5 mm and 5 mm between the discoid insert and the plurality of rigid retaining elements in a first state in which the spring element is relaxed, and
   the form-fitting, variable-force connection has no mechanical backlash between the discoid insert and the plurality of rigid retaining elements in a second state in which the spring element is under mechanical tension.

2. The fastening device according to claim 1, wherein the spring element is configured such that a retaining force increases continuously when the fastening device is actuated, and wherein the retaining force reaches a maximum in the second state.

3. The fastening device according to claim 1, wherein the form-fitting, variable force connection eliminates the mechanical backlash before the discoid insert reaches the second state, when the discoid insert is rotated from the first state to the second state.

4. The fastening device according to claim 1, wherein the discoid insert is a quick-mounting device that is rotatable about the disc axis in parallel with the z-direction.

5. The fastening device according to claim 4, wherein the quick-mounting device comprises a bayonet connector.

6. The fastening device according to claim 1, further comprising a locking device configured to prevent inadvertent release of the NMR probe.

7. The fastening device according to claim 1, wherein the plurality of rigid retaining elements comprises a plurality of opposing retaining elements arranged on a pitch circle about the disc axis having a diameter of between 10 cm and 15 cm, and wherein the opposing retaining elements have a maximum linear extent in a disc plane of the discoid insert of between 5 mm and 10 mm.

8. The fastening device according to claim 7, wherein the opposing retaining elements comprise two retaining bolts with the maximum linear extent in the disc plane of 8 mm.

9. The fastening device according to claim 1, wherein an overall height of the fastening device in parallel with a disc plane of the discoid insert is between 7 mm and 15 mm.

10. The fastening device according to claim 9, wherein the overall height is 10 mm.

11. The fastening device according to claim 1, wherein the spring element is made of a non-magnetic material.

12. The fastening device according to claim 11, wherein the non-magnetic material comprises phosphor bronze.

13. The fastening device according to claim 11, wherein the spring element is integral with the discoid insert.

14. The fastening device according to claim 1, further comprising a retaining portion on which the discoid insert is reversibly mountable, wherein the retaining portion is rigidly fastened to a lower face of the retention system that faces away from the magnet.

15. The fastening device according to claim 14, wherein the retaining portion radially surrounds the discoid insert.

16. The fastening device according to claim 14, further comprising a sliding bearing between the retaining portion and the discoid insert.

17. The fastening device according to claim 16, wherein the sliding bearing comprises sliding partners that are selected to minimize operating force and wear.

18. The fastening device according to claim 17, wherein the sliding partners comprise crystalline polyethylene terephthalate and phosphor bronze.

19. The fastening device according to claim 1, wherein the spring element, a length of the NMR probe, and a length of the retention system are configured to enable a spring excursion of greater than or equal to 2 mm.

20. The fastening device according to claim 1, wherein the retention system comprises a shim system for field shaping of a homogenous magnetic field in an NMR spectrometer.

* * * * *